United States Patent
Kang

(10) Patent No.: US 10,491,012 B2
(45) Date of Patent: *Nov. 26, 2019

(54) BATTERY SYSTEM

(71) Applicant: SAMSUNG SDI CO., LTD., Yongin-si, Gyeonggi-do (KR)

(72) Inventor: Dongyoun Kang, Yongin-si (KR)

(73) Assignee: Samsung SDI Co., Ltd., Yongin-Si, Gyeonggi-do (KR)

( * ) Notice: Subject to any disclaimer, the term of this patent is extended or adjusted under 35 U.S.C. 154(b) by 192 days.

This patent is subject to a terminal disclaimer.

(21) Appl. No.: 15/657,639

(22) Filed: Jul. 24, 2017

(65) Prior Publication Data

US 2018/0026456 A1 Jan. 25, 2018

(30) Foreign Application Priority Data

Jul. 25, 2016 (KR) .......................... 10-2016-0094142

(51) Int. Cl.
*H01M 10/46* (2006.01)
*H02J 7/00* (2006.01)
(Continued)

(52) U.S. Cl.
CPC ...... *H02J 7/0024* (2013.01); *G01R 19/16542* (2013.01); *G01R 31/371* (2019.01); *G01R 31/396* (2019.01); *H01M 10/425* (2013.01); *H01M 10/4207* (2013.01); *H01M 10/441* (2013.01); *H01M 10/482* (2013.01); *H01M 10/61* (2015.04); *H02J 7/0031* (2013.01);
(Continued)

(58) Field of Classification Search
CPC ................... H02J 7/0013; H02J 7/1423; H02J 2007/0037; H02J 2007/004

USPC ................. 320/116, 117, 119, 132, 134, 136
See application file for complete search history.

(56) References Cited

U.S. PATENT DOCUMENTS 7,990,101 B2   8/2011   Hoff et al.
9,300,016 B2   3/2016   Yun
(Continued)

FOREIGN PATENT DOCUMENTS

JP          2013-62951 A      4/2013
KR    10-2009-0008473 A      1/2009
(Continued)

OTHER PUBLICATIONS

U.S. Appl. No. 15/616,530, filed Jun. 7, 2017.
U.S. Office action dated Apr. 4, 2019 to co-pending related U.S. Appl. No. 15/616,530, Dongyoun Kang.

*Primary Examiner* — Edward Tso
(74) *Attorney, Agent, or Firm* — Lee & Morse, P.C.

(57) ABSTRACT

A battery system includes a plurality of battery modules connected in parallel. Each battery module includes a battery, a first output terminal and a second output terminal, a switch circuit connected between the battery and the first output terminal, and a battery manager to detect a battery voltage of the battery and control the switch circuit. Each battery manager is connected to other battery managers through a communication bus and transmits module information of a corresponding battery module to the other battery managers through the bus. Each batter manager also receives module information from the other battery managers through the bus and controls a corresponding switch circuit based on the module information.

16 Claims, 5 Drawing Sheets

(51) Int. Cl.
  *G01R 19/165* (2006.01)
  *H01M 10/61* (2014.01)
  *H01M 10/42* (2006.01)
  *H01M 10/44* (2006.01)
  *H01M 10/48* (2006.01)
  *G01R 31/396* (2019.01)
  *G01R 31/371* (2019.01)

(52) U.S. Cl.
  CPC ......... *H02J 7/0065* (2013.01); *H01M 10/486* (2013.01); *H01M 2010/4271* (2013.01)

(56) References Cited

U.S. PATENT DOCUMENTS

| | | | | |
|---|---|---|---|---|
| 2007/0108946 | A1* | 5/2007 | Yamauchi | H01M 10/42 320/132 |
| 2014/0015477 | A1 | 1/2014 | Tsai | |
| 2014/0028098 | A1 | 1/2014 | Trigiani | |
| 2014/0084867 | A1* | 3/2014 | Hamaoka | H02J 7/0016 320/116 |
| 2017/0054134 | A1* | 2/2017 | Choi | H02J 7/0013 |

FOREIGN PATENT DOCUMENTS

| | | |
|---|---|---|
| KR | 10-2010-0098550 A | 9/2010 |
| KR | 10-2014-0035799 A | 3/2014 |

\* cited by examiner

BATTERY SYSTEM

CROSS-REFERENCE TO RELATED APPLICATION

Korean Patent Application No. 10-2016-0094142, filed on Jul. 25, 2016, and entitled, "Battery System," is incorporated by reference herein in its entirety.

BACKGROUND

1. Field

One or more embodiments described herein relate to a battery system.

2. Description of the Related Art

In order to provide a stable supply of power, direct current (DC) power may be applied to electronic equipment (e.g., communication equipment) that is to be turned on for long periods of time. The DC power may be provided from a battery system. The battery system may provide power even when a power failure occurs or when another DC power source is unavailable. A high-capacity battery system may be formed by connecting battery modules in parallel. If battery modules of different voltages are connected in parallel, an inrush of current may occur. The inrush current may cause a failure to occur in one or more of the battery modules or the entire battery system.

SUMMARY

In accordance with one or more embodiments, a battery system includes a plurality of battery modules connected in parallel, each of the battery modules including: a battery; a first output terminal and a second output terminal; a switch circuit connected between the battery and the first output terminal; and a battery manager to detect a battery voltage of the battery and control the switch circuit, wherein each of the battery managers is connected to other battery managers through a communication bus and is to transmit module information of a corresponding battery module to the other battery managers, receive module information from the other battery managers, and control a corresponding switch circuit based on the module information.

The module information may indicate a battery voltage of the battery and a connection state of the switch circuit. Each of the battery managers may determine terminal voltage between the first output terminal and the second output terminal based on the module information, compare battery voltage of a corresponding battery with the terminal voltage, and control a connection state of a corresponding switch circuit based on a comparison result.

The switch circuit may include a charge switch and a discharge switch connected in series between the battery and the first output terminal; and a precharge switch and a precharge resistor connected in series between the battery and the first output terminal. The module information may indicate a battery voltage of the battery and connection states of the charge switch, the discharge switch, and the precharge switch, each of the battery managers may determine a terminal voltage between the first output terminal and the second output terminal based on the module information, the charge and discharge switches may be opened and the precharge switch may be closed when a difference between battery voltage of a corresponding battery and the terminal voltage is greater than a preset value, and the charge and discharge switches may be closed and the precharge switch may be opened when the difference is equal to or less than the preset value.

The battery manager for a battery module in which the charge and discharge switches are opened may collect battery voltages of battery modules in which the charge and discharge switches are closed based on the module information, and determine a terminal voltage between the first output terminal and the second output terminal based on the battery voltages of the battery modules in which the charge and discharge switches are closed.

When the battery system is turned on, each of the battery managers may collect battery voltages of the other battery modules from the module information, and when a size of battery voltage of a corresponding battery module is in a preset order among sizes of battery voltages of the other battery modules, the charge and discharge switches of a corresponding switch circuit may be closed and the precharge switch of the corresponding switch is to be opened.

Each of the battery managers may have an identification number and is synchronized with the other battery managers. Each of the battery managers may transmit the module information to the other battery managers in an order determined by the identification numbers of the battery managers. The battery managers may simultaneously detect battery voltages of corresponding batteries at a preset timing. Each of the battery managers may transmit the module information to the other battery managers by a broadcast method using the communication bus.

In accordance with one or more other embodiments, an apparatus includes an interface to a bus connected to a plurality of first battery managers; and a second battery manager to transmit information of a corresponding battery module to the first battery managers through the interface and to receive information from the first battery managers through the interface, the second battery manager to generate a signal to control at least one switch based on the information from the first battery managers, the signal to control the at least one switch based on an inrush current condition. The signal may control the at least one switch when a difference between a voltage of the battery module and a voltage between first and second output terminals of the battery module is within an inrush current preset range. The information may indicate a voltage of the battery module. The second battery manager may transmit the information of a corresponding battery module to the first battery managers through the interface at a timing determined by an order of the second battery manger relative to the first battery managers. The order may be based on an identification number of the battery module.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
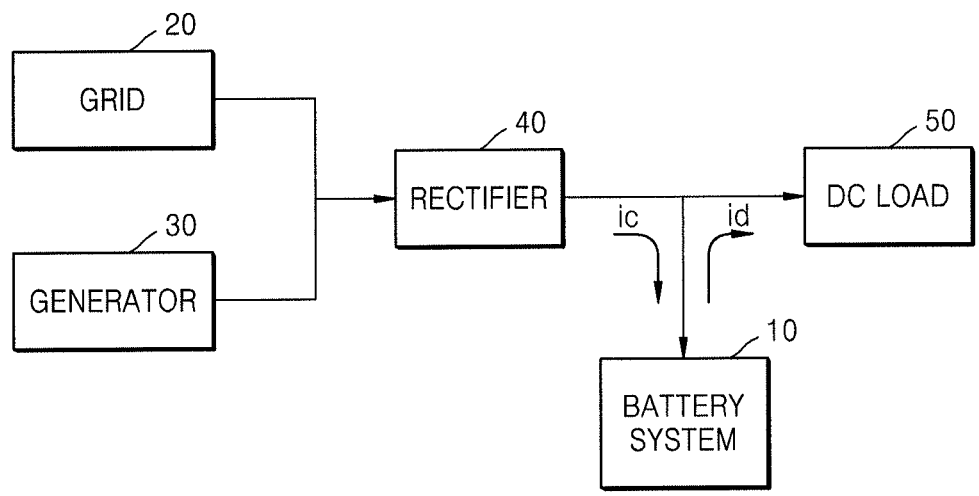
FIG. 1 illustrates a usage example of an embodiment of a battery system.

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

FIG. 1 illustrates an example of the usage of a battery system. Referring to FIG. 1, a grid 20 includes a power plant, a substation, and a power line. The grid 20 may be referred to as an electric grid or a commercial electric grid supplying commercial power. In normal cases (e.g., when the grid 20 is operating normally or is in a normal state), a rectifier 40 may receive alternating current (AC) electricity from the grid 20. However, when the grid 20 is operating abnormally or is in abnormal state (e.g., when a power failure occurs), a generator 30 may supply AC electricity to the rectifier 40.

The generator 30 is a system that produces AC electricity from an energy source. For example, the generator 30 may be an engine generator that produces electric energy using fossil fuels. In one embodiment, the generator 30 may be a diesel generator. The generator 30 may generate electricity and supply the electricity to the rectifier 40.

The rectifier 40 converts AC electricity from the grid 20 or the generator 30 to DC electricity for a DC load 50. The DC electricity output from the rectifier 40 may be provided to the DC load 50 or used to charge a battery system 10. For example, the rectifier 40 may be a power supply that uses a device (e.g., a switching transistor) to convert AC power to DC power by a switch control method. In this case, the rectifier 40 may be a switched mode power supply (SMPS) for outputting stable DC power by controlling the ratio of on and off times of a semiconductor switching device. In another example, the rectifier 40 may have a converter function to convert DC electricity stored in the battery system 10 to AC electricity for supply to the grid 20. The rectifier 40 may be, for example, a bidirectional converter.

The battery system 10 is connected between the rectifier 40 and the DC load 50. The battery system 10 may be charged using DC current output from the rectifier 40. DC current output from the rectifier 40 to the battery system 10 may be referred to, for example, as charge current ic. Some of the DC current from the rectifier 40 may be supplied to the DC load 50. Another portion, or a remaining portion, of the DC current may be supplied to the battery system 10 as charge current ic. When DC current is not output from the rectifier 40 due to a power failure or the like, or the amount of DC current output from the rectifier 40 is less than the amount of current consumption by the DC load 50, the battery system 10 may supply DC electricity to the DC load 50. Current from the battery system 10 to the DC load 50 may be referred to as discharge current id.

The DC load 50 may be a load consuming DC electricity supplied from the rectifier 40 or the battery system 10. The DC load 50 may be an electric load that is to operate without interruption. Even when the rectifier 40 is out of order, the DC load 50 may operate without interruption by receiving DC current from the battery system 10.

The DC load 50 may include, for example, high-speed information communication equipment, intelligent home network equipment, telephones, interphones, guidance, display devices, broadcasting devices, or alarm devices. In one embodiment, the DC load 50 may be wireless communication equipment installed in a base station for connecting terminals to a network. When DC electricity is not supplied to the DC load 50 and operation of the DC load 50 stops, wireless communication may become impossible within coverage of the base station. Therefore, DC electricity may be stably supplied to the DC load 50 without interruption.

Figure 2:
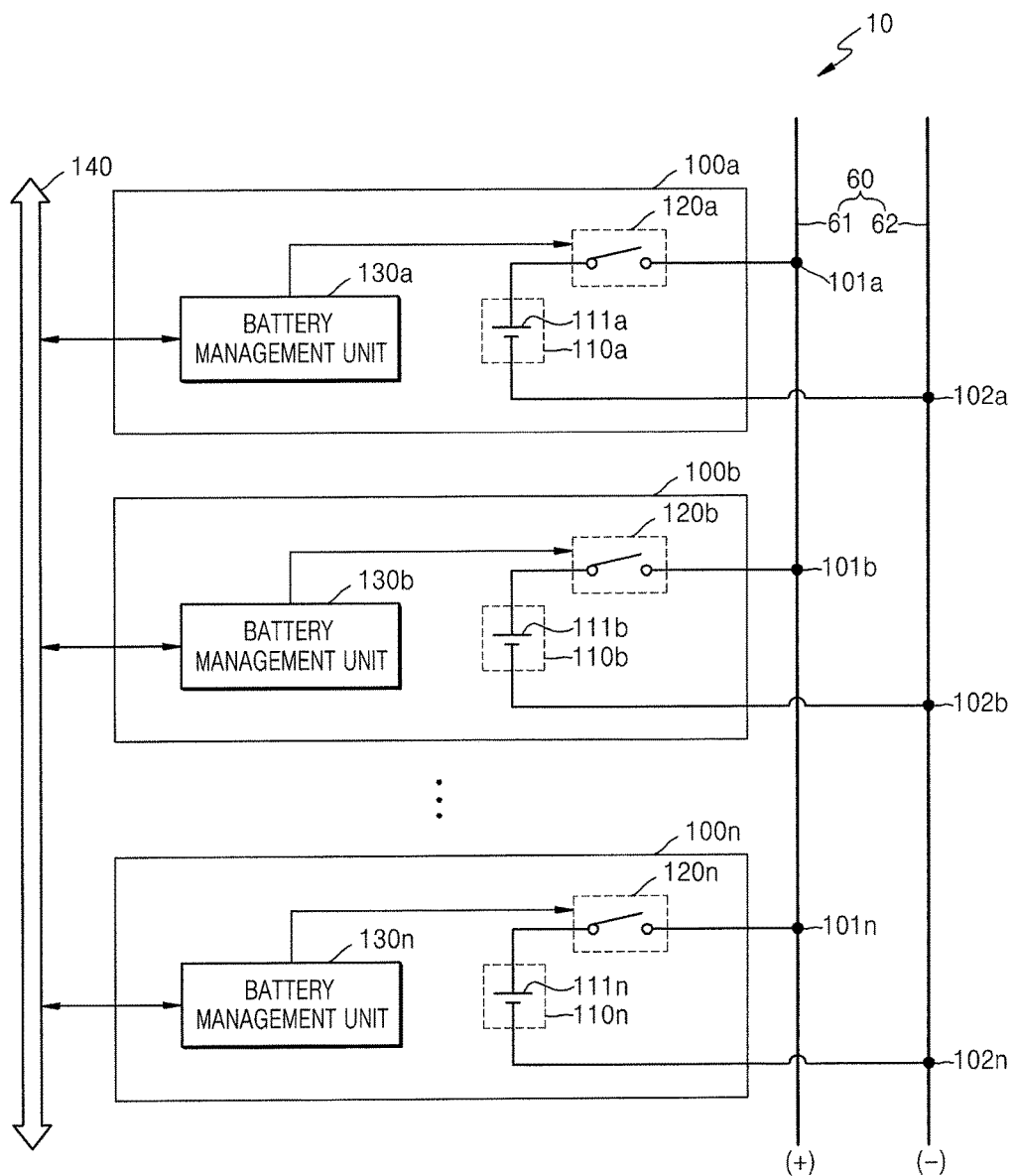
FIG. 2 illustrates an embodiment of the battery system.

FIG. 2 illustrates an embodiment of a battery system, which, for example, may be the battery system 10 in FIG. 1. Referring to FIG. 2, the battery system 10 includes a plurality of battery modules 100a to 100n connected in parallel using a pair of bus bars. The bus bars may be collectively referred to as bus bars 60, and the battery modules 100a to 100n may be collectively referred to as battery modules 100. The battery system 10 may include a communication bus 140 providing a communication path between the battery modules 100. The bus bars may include a first but bar 61 and a second bus bar 62. The first bus bar 61 may be referred to as a first node, and the second bus bar 62 may be referred to as a second node.

The battery modules 100a to 100n may respectively include batteries 110a to 110n, first and second output terminals 101a to 101n and 102a to 102n respectively connected to the first and second bus bars 61 and 62, switch units 120a to 120n connected between the batteries 110a to 110n and the first output terminals 101a to 101n, and battery management units (e.g., battery managers) 130a to 130n to detect battery voltages of the batteries 110a to 110n and control the switch units 120a to 120n.

The battery module 100a may include, for example, the battery 110a, the first and second output terminals 101a to 102a, the switch unit 120a, and the battery management unit 130a. The battery module 100b may include the battery 110b, the first and second output terminals 101b and 102b, the switch unit 120b, and the battery management unit 130b. The battery module 100n may include, for example, the battery 110n, the first and second output terminals 101n and 102n, the switch unit 120n, and the battery management unit 130n. The batteries 110a to 110n, the battery cells 111a to 111n, the first and second output terminals 101a to 101n and 102a to 102n, the switch units 120a to 120n, and the battery management units 130a to 130n may be collectively referred to as batteries 110, battery cells 111, first and second output terminals 101 and 102, switch units 120, and battery management units 130, respectively, when general characteristics thereof are described without specifying a particular battery module (for example, the battery module 100a).

The battery management units 130a to 130n are connected to and communicate with each other through the communication bus 140. Each battery management unit 130

(e.g., battery management unit 130a of the battery module 100a) may transmit module information relating to corresponding battery module 100a to the other battery management units 130b to 130n, receive module information from the other battery management units 130b to 130n, and control the corresponding switch unit 120a based on the module information.

Like the battery management unit 130a, the battery management unit 130b of the battery module 100b may transmit module information relating to corresponding battery module 100b to the other battery management units 130a and 130c to 130n, receive module information from the other battery management units 130a and 103c to 130n, and control the corresponding switch unit 120b based on the module information.

In at least one embodiment, the expression "corresponding" may indicate a battery module in which the object of description is included or elements of the battery module. For example, a battery module corresponding to the battery management unit 130a may be battery module 100a in which battery management unit 130a is included. A battery corresponding to the battery management unit 130a may be battery 110a of battery module 100a in which the battery management unit 130a is included.

In at least one embodiment, the expression "other" may indicate elements other than the object of description or to indicate elements other than elements corresponding to the object of description. For example, when the battery management unit 130a is described, the other battery management units may refer to battery management units 130b to 130n other than the battery management unit 130a. In addition, when the battery management unit 130a is described, the other batteries may refer to batteries 110b to 110n other than the battery 110a corresponding to the battery management unit 130a.

The bus bars 60 are connected between the rectifier 40 (e.g., refer to FIG. 1) and the DC load 50 (e.g., refer to FIG. 1). DC electricity output from the rectifier 40 is supplied to the DC load 50 through the bus bars 60. In FIG. 2, the first bus bar 61 is positive and the second bus bar 62 is negative. In another embodiment, The second bus bar 62 may be grounded. The bus bars 60 may be replaced with one or more other power-transmission elements, e.g., power cables or a bus duct.

The battery modules 100a to 100n are connected in parallel through the bus bars 60, so that the battery modules 100a to 100n may be independently charged with DC electricity from the rectifier 40 and may independently supply DC electricity to the DC load 50. Even when one of the battery modules 100a to 100n (e.g., battery module 100a) is separated from the bus bars 60 due to a breakdown or for replacement, operations of the other battery modules 100b to 100n are not affected but only the total capacity of the battery system 10 may decrease.

All the battery modules 100a to 100n may be connected to the communication bus 140 to communicate with each other. In addition to the battery modules 100a to 100n, a communication device may be connected to the communication bus 140. The communication device may collect module information transmitted from the battery modules 100a to 100n. However, the communication device may not control the battery modules 100a to 100n. The battery modules 100a to 100n may independently operate according to internal algorithms. For example, the battery module 100a may receive module information from the other battery modules 100b to 100n, but the battery modules 100b to 100n may not control the battery module 100a. The battery modules 100a to 100n may have the same connection structure and algorithm, except that the battery modules 100a to 100n may have different identification numbers. In one embodiment, the battery modules 100a to 100n may be substantially identical.

The battery modules 100 include the batteries 110, the switch units 120, and the battery management units 130. The battery modules 100 include the first and second output terminals 101 and 102 respectively connected to the first and second bus bars 61 and 62. In FIG. 2, the first bus bar 61 is positive. Thus, the first output terminals 101 are connected to positive electrodes of the batteries 110 and the second output terminals 102 are connected to negative electrodes of the batteries 110. In one embodiment, the first and second output terminals 101 and 102 may be paths formed of electric wires or power cables through which charge current flows to the batteries 110 and discharge current flows outward from the batteries 110. In this case, the electric wires or power cables may be fixed to the bus bars 60, for example, using bolts and nuts.

Each of the batteries 110 stores electricity and includes at least one battery cell 111. In FIG. 2, each of the batteries 110 includes one battery cell 111. In one embodiment, each of the batteries 110 may include a plurality of battery cells 111. The battery cells 111 may be connected in series, parallel, or series-parallel. The number of battery cells 111 in each of the batteries 110 may be determined, for example, according to an output voltage level of rectifier 40 or a voltage level required by the DC load 50.

The battery cell 111 may include a rechargeable secondary battery cell. Examples of the battery cell 111 may include nickel-cadmium battery cells, lead battery cells, nickel metal hydride (NMH) battery cells, lithium-ion battery cells, and lithium polymer battery cells.

As illustrated in FIG. 2, the batteries 110a to 110n are electrically connected in parallel to the bus bars 60 respectively through the corresponding switch units 120a to 120n. For example, the batteries 110a to 110n are selectively connected to the bus bars 60 by the corresponding switch units 120a to 120n. In at least one embodiment, the expression "selectively connected" may indicate that an element connected or disconnected according to an external control signal, for example, from a battery management unit.

As shown in FIG. 2, the batteries 110 are electrically connected in parallel to the bus bars 60 when the switch units 120 are closed. The batteries 110 are electrically separated when the switch units 120 are opened. For example, the battery 110a corresponding to the switch unit 120a is electrically connected to the bus bars 60 when the switch unit 120a is closed. The battery 110a is electrically separated from the bus bars 60 when the switch unit 120a is opened.

The switch units 120 are between the batteries 110 and the first output terminals 101. In one embodiment, the switch units 120 may be between the batteries 110 and the second output terminals 102. The switch units 120 may include, for example, relay switches or field effect transistors (FETs).

The battery management units 130 may be connected to the batteries 110 and the switch units 120 corresponding to the battery management units 130. The battery management units 130 may control operations of the battery modules 100 according to internal algorithms. For example, the battery management units 130 may perform functions including overcharge protection, overdischarge protection, overcurrent protection, overvoltage protection, overheat protection, and/or cell balancing.

The battery management unit 130 detects the battery voltage of the corresponding battery 110. The battery voltages may be cell voltages of the battery cells 111 of the batteries 110. When each of the batteries 110 includes a plurality of battery cells 111, each of the battery voltages may include a cell voltage of each of the battery cells 111. To this end, the battery management units 130 may be electrically connected to nodes between the battery cells 111. In this case, the battery voltage may be an arithmetic sum of the detected cell voltages. The arithmetic sum of the cell voltages may be, for example, a voltage between a positive electrode and a negative electrode of each of the batteries 110. The voltage of the positive electrode and the negative electrode of each of the batteries 110 may be referred to as a module voltage output from the battery modules 100.

In another example, the battery management units 130 may directly detect module voltages of the batteries 110. To this end, the battery management units 130 may be connected to positive and negative electrodes of the batteries 110 through wires.

In one embodiment, each of the battery management units 130 may include a battery voltage detector to directly detect the module voltage of the batteries 110. The battery voltage detector may include, for example, an analog-digital converter (ADC) connecting to the corresponding battery 110. The ADC may convert battery voltage of each of the batteries 110 to a digital signal using a voltage divider, connected between a positive electrode and a negative electrode of each corresponding battery 110.

The battery management units 130 may periodically detect battery voltages of corresponding batteries 110. For example, the battery management units 130 may detect battery voltages of corresponding batteries 110 at preset intervals (e.g., every 500 ms).

The battery management units 130 may detect charge and discharge currents and temperatures of the batteries 110 in addition to detecting battery voltages of the batteries 110. For example, the battery management units 130 may detect charge and discharge currents and temperatures of the corresponding batteries 110 using current sensors and temperature sensors. The battery management units 130 may calculate values such as a state of charge (SOC), a state of health (SOH), or a remaining lifespan based on detected battery voltages, charge and discharge currents, and/or temperatures. Also, the battery management units 130 may detect terminal voltages between the first and second output terminals 101 and 102 of the battery modules 100. In addition, the battery management units 130 may detect connection states of the switch units 120. When each of the switch units 120 includes a plurality of switches, the battery management units 130 may detect whether each of the switches is opened or closed.

The battery management units 130 may manage the batteries 110 based on detection and calculation results. The battery management units 130 may control the switch units 120 to manage the batteries 110. The battery management units 130 may output control signals according to internal algorithms to control the switch units 120.

In an example, when detected temperatures of the batteries 110 are not within a preset normal range, the battery management units 130 may perform an operation according to a preset internal algorithm in order to protect the batteries 110. For example, when temperatures of the batteries 110 are greater than a first set value, the battery management units 130 may control the switch units 120 to limit the magnitudes of charge and discharge currents of the batteries 110. For example, when temperatures of the batteries 110 are greater than a second set value, which is greater than the first set value, the battery management units 130 may control the switch units 120 to block charge and discharge of the batteries 110.

In one embodiment, when the detected voltages of the batteries 110 are not within a preset normal range, the battery management units 130 may perform an operation according to a preset internal algorithm in order to protect the batteries 110.

The battery management units 130 may be connected to the communication bus 140 to communicate with each other. A controller area network (CAN) communication protocol may be used for communication between the battery management units 130. In one embodiment, another communication protocol may be used to transmit data on the communication bus 140 may be used. In addition to the battery management units 130, an external device may be connected to the communication bus 140. The external device may collect module information transmitted through the communication bus 140. The external device may receive module information transmitted between the battery management units 130 through a communication board connected to the communication bus 140.

The battery management units 130a to 130n connected to the communication bus 140 may be synchronized. For example, the time of one of the battery management units 130a to 130n (for example, the battery management unit 130a) may be selected as a reference. The times of the other battery management units 130b to 130n may be synchronized with the time of battery management unit 130a. The battery management units 130a to 130n may detect battery voltages of corresponding batteries 110 according to preset timing. In this case, battery voltages may be detected at the same time. A battery management unit having the lowest identification number may be determined, for example, as a reference battery management unit for synchronization.

The battery management units 130 may transmit module information relating to corresponding battery modules 100 to communication bus 140. The battery management units 130 may transmit module information about corresponding battery modules 100 to the communication bus 140 in a preset order. The preset order may be determined, for example, according to identification numbers of the battery management units 130.

In one embodiment, the battery management units 130 may have unique identification numbers that do not overlap each other. For example, a battery management unit 130 having a low identification number may first transmit module information. Each of the battery management units 130 may check how many identification numbers of other battery management units 130 are lower than its own identification number. Each battery management unit 130 may transmit its module information after the battery management units 130 having lower identification numbers transmit module information and a time period corresponding to its turn elapses.

The following description is an example given under the assumption that battery management unit 130a has the lowest identification number, the battery management unit 130b has the second lowest identification number, and the battery management unit 130n has the highest identification number.

Figure 3:
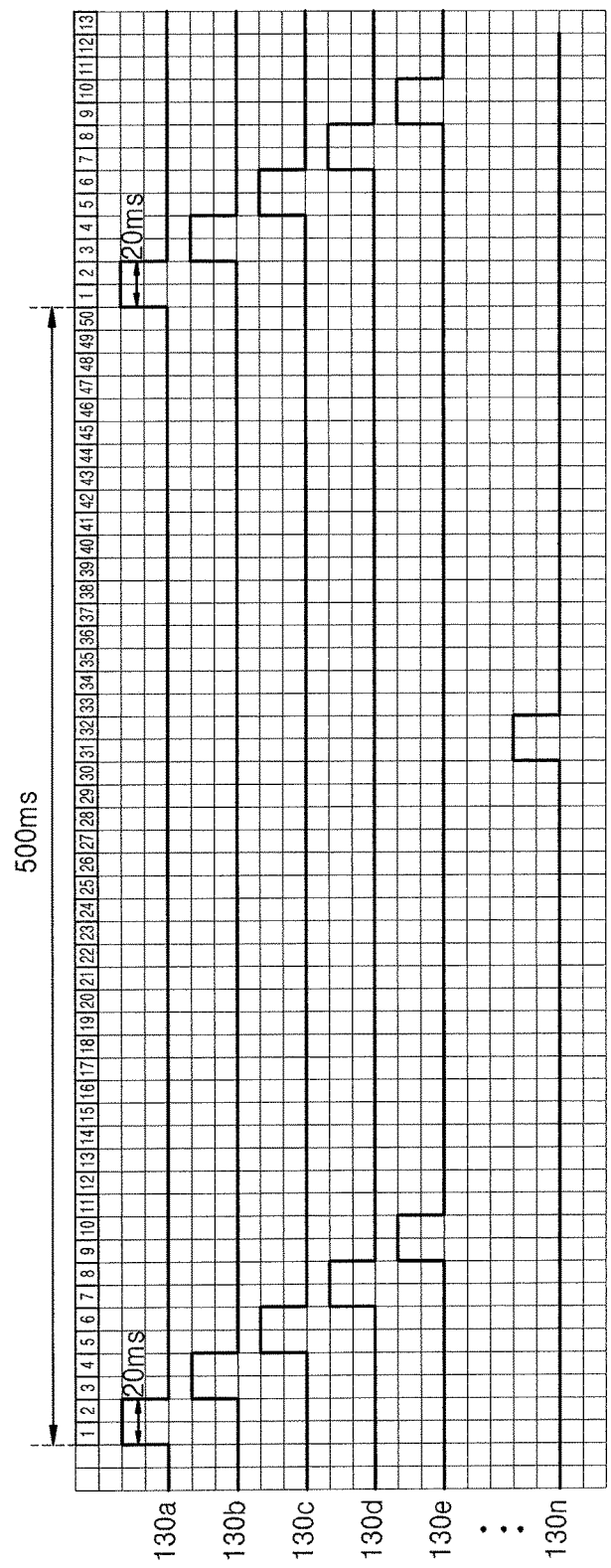
FIG. 3 illustrates an embodiment for transmitting module information.

FIG. 3 is a timing diagram illustrating an embodiment for transmit module information from the battery management units 130. In this example, the battery system 10 includes sixteen battery modules 100. The number of battery modules 100 may be greater or less than sixteen in another embodiment.

Referring to FIG. 3, in the uppermost row of the timing diagram, numbers are shown, each of which correspond to a time period of 10 ms. (The time period may be of a different duration in another embodiment). A first battery management unit 130a of a first battery module 100a first transmits module information relating to the first battery module 100a to the communication bus 140. A second battery management unit 130b transmits module information relating to a second battery module 100b, for example, 20 ms, after the first battery management unit 130a starts to transmit module information relating to the first battery module 100a. The first battery management unit 130a may complete transmission of module information before the second battery management unit 130b starts to transmit module information, e.g., the first battery management unit 130a may complete transmission of module information, for example, within 20 ms. A sixteenth battery management unit 130n transmits module information relating to a sixteenth battery module 100n, for example, 300 ms (20 ms×15), after the first battery management unit 130a starts to transmit module information.

The battery management units 130 may sequentially transmit module information to the communication bus 140, for example, by a broadcast method. Therefore, each of the battery management units 130 may receive module information relating to the other battery modules 100 from the other battery management units 130. For example, second to sixteenth battery management units 130b to 130n may receive module information transmitted by the first battery management unit 130a. The first and third to sixteenth battery management units 130a and 130c to 130n may receive module information transmitted by the second battery management unit 130b. The first to fifteenth battery management units 130a to 130(n−1) may receive module information transmitted by the sixteenth battery management unit 130n.

The battery management units 130 may transmit module information in each preset time period (for example, 500 ms). In addition, the battery management units 130 may detect values (e.g., battery voltages, charge and discharge currents, and/or temperatures) of corresponding batteries 110 and may control corresponding switch units 120 at a preset timing after the last battery management unit 130n transmits module information (e.g., about 400 ms after the first battery management unit 130a starts to transmit module information). Therefore, although parameters of the battery system 10 vary with time, detected data may be highly reliable because the battery management units 130 detect the parameters at the same time. In addition, some of the switch units 120 may not be opened or closed late because the switch units 120 are simultaneously controlled. Thus, errors caused by concentration of charge or discharge current in one of the battery modules 100 may be prevented.

When the period during which the battery management units 130 transmit module information is 500 ms as in the above example, the number of battery modules 100 in the battery system 10 may be set to sixteen by taking detection and control times into consideration. The maximum number of battery modules 100 in the battery system 10 may be different in another embodiment according to, for example, the module information transmission period and/or the amount of module information.

Referring to FIG. 2, module information relating to the battery modules 100 that the battery management units 130 transmit may include battery voltages of the batteries 110 and connection states of the switch units 120. For example, the battery voltages of the batteries 110 may include cell voltages of the battery cells 111. Also, the battery voltages of the batteries 110 may be an arithmetic sum of cell voltages of the battery cells 111. In one embodiment, battery voltages of the batteries 110 may include voltages between positive electrodes and negative electrodes of the batteries 110. The connection states of the switch units 120 may include on-off states of switches in switch units 120.

Each of the battery management units 130 receives module information from the other battery management units 130. After a module information transmission period, each of the battery management units 130 has module information relating to a corresponding battery module 100 and module information relating to the other battery modules 100. Each of the battery management units 130 controls a corresponding switch unit 120 based on collected module information.

In an example, each of the battery management units 130 may determine a terminal voltage between the first and second output terminals 101 and 102 based on the collected module information, compare the terminal voltage with battery voltage of the corresponding battery 110, and control a connection state of the corresponding switch unit 120 based on the comparison result. The first output terminals 101 of the battery modules 100 are all connected to the first bus bar 61. The second output terminals 102 of the battery modules 100 are all connected to the second bus bar 62. Thus, terminal voltage between the first output terminal 101 and the second output terminal 102 is the same as voltage between the bus bars 60.

A switch unit 120a of at least one of the battery modules 100 (for example, the first battery module 100a) is closed. In this case, terminal voltage between the first and second output terminals 101 and 102 is the same as voltage between a positive electrode and a negative electrode of a battery 110a of the battery module 100a in which the switch unit 120a is closed. Therefore, each of the battery management units 130 may detect whether the switch unit 120a of the battery module 100a is closed based on module information. Each of the battery management units 130 may regard battery voltage of the battery module 100 in which the switch unit 120 is closed as terminal voltage between the first and second output terminals 101 and 102. The battery voltage may refer to voltage between the positive and negative electrodes of the battery 110a.

Each of the battery management units 130 may compare terminal voltage between the first and second output terminals 101 and 102 with voltage between the positive and negative electrodes of the corresponding battery 110, that is, battery voltage. For example, when a difference between terminal voltage and battery voltage is within a preset range, each of the battery management units 130 may close the corresponding switch unit 120. However, when a difference between terminal voltage and battery voltage is not within a preset range, each of the battery management units 130 may control the switch unit 120 to operate in a precharge mode. Then, when the difference between terminal voltage and battery voltage is within the preset range after the precharge operation, each of the battery management units 130 may complete the operation in the precharge mode and close the corresponding switch unit 120.

When the battery system 10 is turned off, the battery management units 130 control the corresponding switch units 120 to electrically separate the corresponding batteries 110 from the bus bars 60.

When the battery system 10 is turned on, each of the battery management units 130 of the battery modules 100 may electrically connect the corresponding battery 110 to the bus bars 60 according to internal algorithm and charge or discharge the battery 110. For example, when the battery system 10 is turned on, each of the battery management units 130 transmits data including its identification number to the communication bus 140, for example, by a broadcast method. Each of the battery management units 130 may check how many identification numbers of other battery management units 130 are lower than its own identification number. Each of the battery management units 130 is synchronized with the time of a battery management unit having the lowest identification number (for example, the battery management unit 130a). The battery management unit 130a having the lowest identification number starts to transmit its module information to other battery management units 130b to 130n through the communication bus 140, for example, by a broadcast method.

Next, after a preset time period, a battery management unit having the second lowest identification number (for example, the battery management unit 130b) transmits its own module information to other battery management units 130a and 130c to 130n through the communication bus 140, for example, by a broadcast method. In this manner, a battery management unit having the highest identification number (for example, the battery management unit 130n) transmits its own module information to other battery management units 130a to 130(n−1), for example, by a broadcast method using the communication bus 140. Each of the battery management units 130 collects module information of other battery modules 100 as well as its own module information. In this case, the switch units 120 of the battery modules 100 are all opened.

Each of the battery management units 130 checks how many other battery modules 100 have greater battery voltages than its own battery voltage to determine its order in terms of a size of the battery voltage. When the size of the battery voltage for the battery management unit 130 is in a preset order, the battery management units 130 may control the corresponding switch units 120 when the corresponding switch units 120 are closed. For example, when the number of battery modules 100 in the battery system 10 is n, a preset turn may be set to be an integer close to n/2. For example, when the number of battery modules 100 in the battery system 10 is 16, a preset turn may be 8th.

When a preset module information transmission period (for example, 500 ms) has elapsed, the battery management units 130 may sequentially transmit module information. Each of the battery management units 130 may control the corresponding switch unit 120 based on the collected module information. As described above, only when a difference between battery voltage of the battery module 100 and terminal voltage between the first and second output terminals 101 and 102 is within a preset range, the switch unit 120 is closed. Thus, inrush current does not occur. The preset range may, therefore, be considered to be an inrush current preset range corresponding to an inrush current preset condition.

Figure 4:
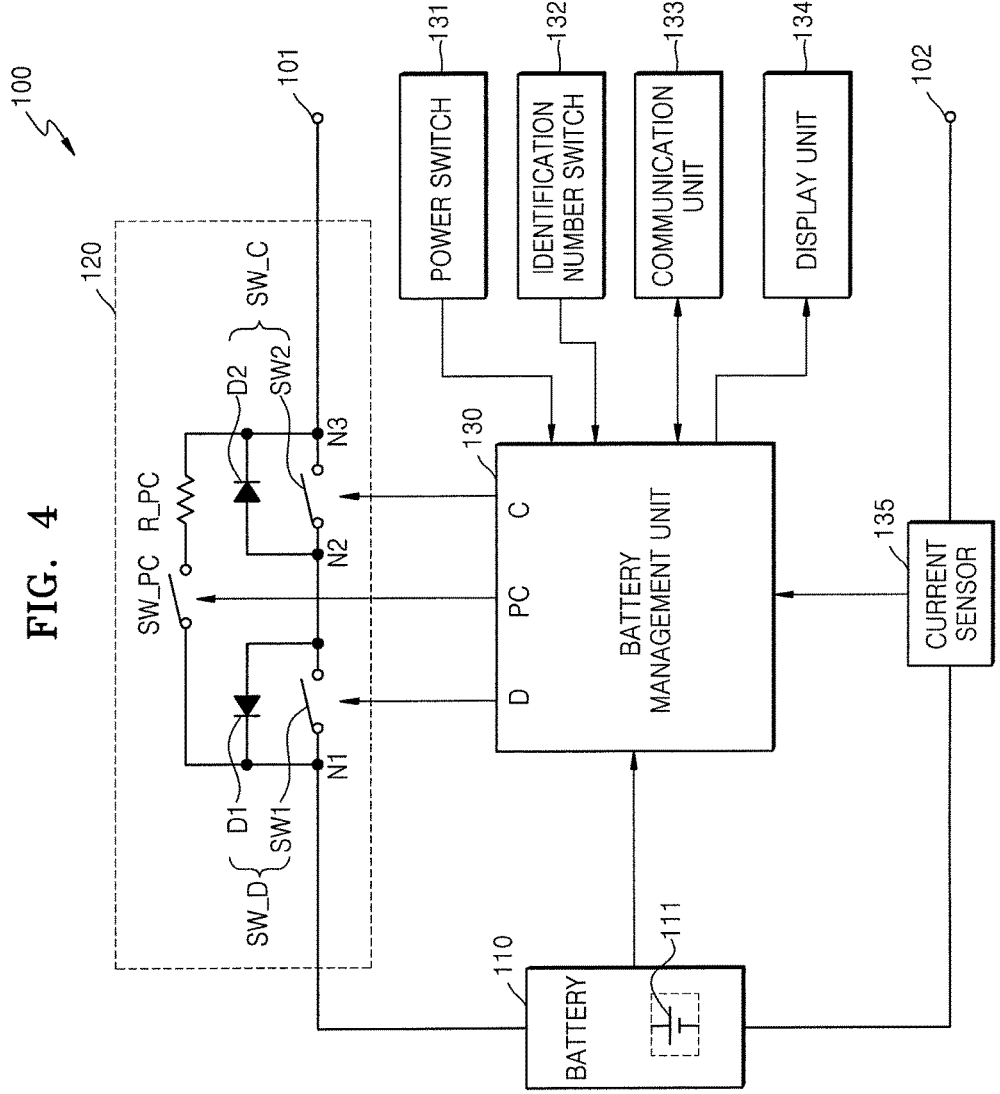
FIG. 4 illustrates an embodiment of a battery module.

FIG. 4 illustrates an embodiment of a battery module, which, for example, may correspond to battery module 100. Referring to FIG. 4, the battery module 100 includes a battery 110, a switch unit 120, and a battery management unit 130. The battery module 100 includes a first output terminal 101 and a second output terminal 102. The battery 110 includes at least one battery cell 111. The battery module 100 may be representative of each of the battery modules 100a to 100n in FIG. 2.

The battery management unit 130 detects the battery voltage of the battery 110. A battery voltage may refer to a voltage between the positive and negative electrodes of the battery 110. The battery voltages may include cell voltages of the battery cells 111 of the batteries 110. The battery voltage may include an arithmetic sum of the cell voltages. The battery management unit 130 may detect charge and discharge currents of the battery 110 using a current sensor 135. The battery management unit 130 may detect the temperature of the battery 110 using a temperature sensor.

The battery module 100 may include a power switch 131, an identification number switch 132, a communication unit 133, and a display unit 134. The battery module 100 may be turned on and off using the power switch 131. The battery system 10 includes a plurality of battery modules 100. Even when a power switch 131 of one of the battery modules 100 is manipulated, all the battery modules 100 may be turned on or off.

The identification number switch 132 is provided to assign an identification number to the battery module 100. An operator may manipulate the identification number switch 132 to set an identification number of the battery module 100. The battery system 10 includes a plurality of battery modules 100, and the battery modules 100 have different identification numbers.

The communication unit 133 is connected between the battery management unit 130 and the communication bus 140. The battery management unit 130 is connected to the communication bus 140 through the communication unit 133, so that the battery management unit 130 may communicate with other battery management units 130.

The display unit 134 may display the SOC and module state of the battery module 100. For example, the display unit 134 may include a plurality of light-emitting devices, e.g., four light-emitting diodes (LEDs).

The display unit 134 may turn on all four LEDs to indicate that the SOC of the battery module 100 is about 75% or greater. The display unit 134 may turn on only three LEDs to indicate that the SOC of the battery module 100 ranges from about 50% to less than about 75%. The display unit 134 may turn on only two LEDs to indicate that the SOC of the battery module 100 ranges from about 25% to less than about 50%. The display unit 134 may turn on only one LED to indicate that the SOC of the battery module 100 is less than about 25%.

The display unit 134 may indicate the module state of the battery module 100 by periodically turning on and off the four LEDs. The display unit 134 may indicate sixteen module states using the four LEDs. For example, the display unit 134 may indicate states such as an overvoltage state, a low-voltage state, a high-temperature state, a low-temperature state, an overcharge current state, an overdischarge current state, a communication error state, a cell voltage detection error state, a current sensor and switch error state, a high-temperature error state, a high-voltage error state, a low-voltage error state, and/or a cell voltage imbalance error state.

The switch unit 120 may include a charge switch SW_C and a discharge switch SW_D connected in series between a first node N1 and a third node N3. Charge and discharge currents of the battery 110 flow through a path including the charge switch SW_C and the discharge switch SW_D. The path may be referred to as a high-current path. The first node N1 is connected to a positive electrode of the battery 110, and the third node N3 is connected to the first output terminal 101.

The discharge switch SW_D includes a first switch SW1 and a first diode D1 connected in parallel between the first node N1 and a second node N2. The first diode D1 has a forward direction in which charge current flows from the second node N2 to the first node N1. Therefore, when the first switch SW1 is opened, charge current may flow but discharge current does not flow. When the first switch SW1 is closed, charge and discharge currents may flow. In this regard, the discharge switch SW_D may be referred to as a discharge control switch. The first switch SW1 is controlled by a discharge control signal output from a discharge control terminal D of the battery management unit 130.

The charge switch SW_C includes a second switch SW2 and a second diode D2 connected in parallel between the second node N2 and the third node N3. The second diode D2 has a forward direction in which discharge current flows from the second node N2 to the third node N3. Therefore, when the second switch SW2 is opened, discharge current may flow but charge current may not flow. When the second switch SW2 is closed, charge and discharge currents may flow. The charge switch SW_C may be referred to as a charge control switch. The second switch SW2 is controlled by a charge control signal output from a charge control terminal C of battery management unit 130.

In addition, the switch unit 120 may include a precharge switch SW_PC and a precharge resistor R_PC connected in series between the first node N1 and the third node N3. A path including the precharge switch SW_PC and the precharge resistor R_PC may be referred to as a precharge path. Since the precharge resistor R_PC is on the precharge path, charge and discharge currents of the battery 110 are limited to a value which does not damage the battery 110. The precharge switch SW_PC is controlled by a precharge control signal output from a precharge control terminal PC of the battery management unit 130.

Figure 5:
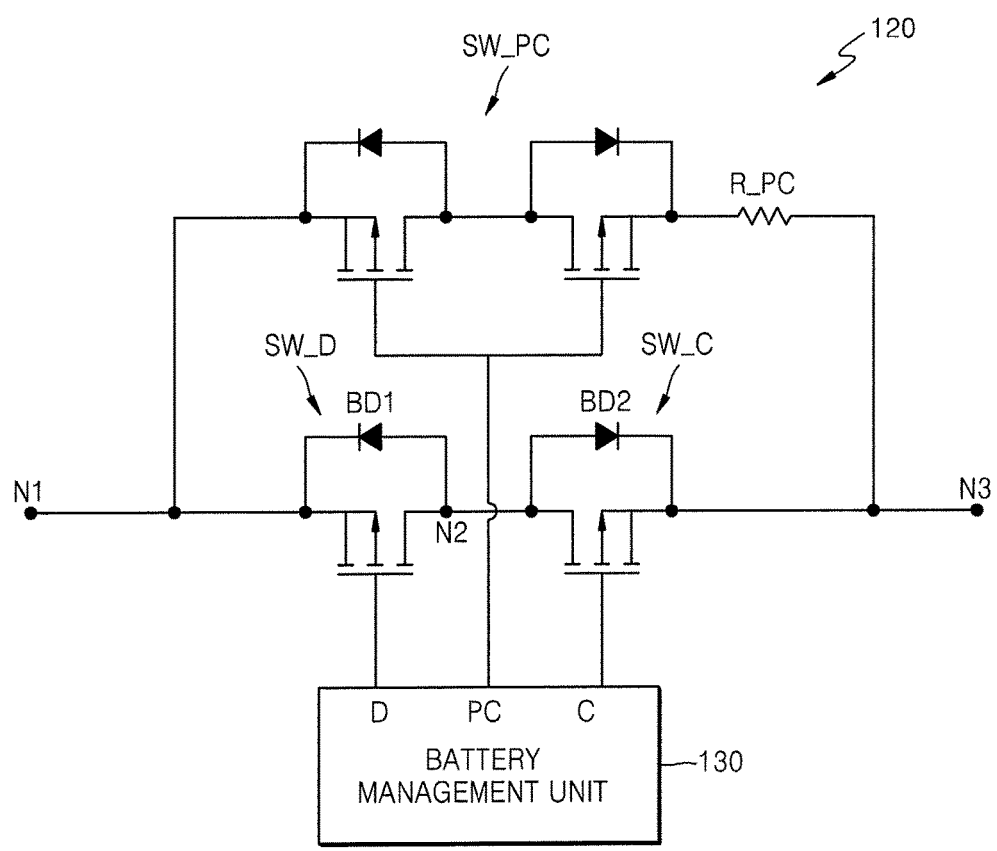
FIG. 5 illustrates an embodiment of a switch arrangement.

FIG. 5 illustrates an embodiment of a switch arrangement. Referring to FIG. 5, the discharge switch SW_D may include a power MOSFET, which, for example, may be a p-type power MOSFET having a source connected to the first node N1, a drain connected to the second node N2, and a gate connected to the discharge control terminal D of the battery management unit 130. The power MOSFET includes a body diode BD1 extending in a direction from the second node N2 to the first node N1.

The charge switch SW_C may include a power MOSFET, which, for example, may be a p-type power MOSFET having a source connected to the third node N3, a drain connected to the second node N2, and a gate connected to the charge control terminal C of the battery management unit 130. The power MOSFET includes a body diode BD2 having a direction from the second node N2 to the third node N3.

The precharge switch SW_PC may include two power MOSFETs connected in series. One of the power MOSFETs may be disposed in the same manner as the discharge switch SW_D. The other power MOSFET may be disposed in the same manner as the charge switch SW_C. Gates of the two power MOSFETs may be connected to the precharge control terminal PC of the battery management unit 130.

Referring to FIGS. 3 and 4, the battery management unit 130 transmits its own module information to the communication bus 140 through the communication unit 133 and receives module information from other battery management units 130. In this case, the module information includes battery voltage of the battery 110, a connection state of the charge switch SW_C, a connection state of the discharge switch SW_D, and a connection state of the precharge switch SW_PC. In addition, the module information may include a charge state and/or module state displayed by the display unit 134.

The battery management unit 130 may determine terminal voltage between the first and second output terminals 101 and 102 based on the collected module information. According to an embodiment, a battery management unit 130 of a battery module 100 (in which charge and discharge switches SW_C and SW_D are opened) may obtain battery voltage of a battery module 100 (in which charge and discharge switches SW_C and SW_D are closed) based on the collected module information. The battery management unit 130 may determine terminal voltage between the first and second output terminals 101 and 102 based on battery voltage of the battery module 100 in which the charge and discharge switches SW_C and SW_D are closed. If the battery voltage corresponds to cell voltages of the battery cells 111, the battery management unit 130 may sum up all the cell voltages of the battery module 100 in which the charge and discharge switches SW_C and SW_D are closed to determine the terminal voltage between the first and second output terminals 101 and 102.

The battery management unit 130 may detect the difference between a battery voltage (e.g., a battery voltage between a positive electrode and a negative electrode of the battery 110) and terminal voltage. When the difference is greater than a preset voltage value, the battery management unit 130 may open the charge and discharge switches SW_C and SW_D and close the precharge switch SW_PC. Since only a precharge path is connected between the first node N1 and the third node N3, a limited amount of charge and discharge current may flow by a precharge resistor. Thus, inrush current may not occur. The limited amount of charge and discharge current may flow through the precharge path, and the difference between battery voltage of the battery 110 and terminal voltage may gradually be decreased. When the difference is less than a preset voltage value, the battery management unit 130 may close the charge and discharge switches SW_C and SW_D and open the precharge switch SW_PC.

In one embodiment, when battery voltage of the battery 110 is greater than terminal voltage by a preset voltage value or more, the battery management unit 130 may only open the discharge switch SW_D. When battery voltage of the battery 110 is less than terminal voltage by a preset voltage value or more, the battery management unit 130 may only open the charge switch SW_C.

Thus, when the battery system 10 is turned on, each of the battery management units 130 collects battery voltages of other battery modules 100 from the collected module information. When a battery module 100 having a certain size of battery voltage has a preset turn determined based on sizes of battery voltages of other battery modules 100, the charge and discharge switches SW_C and SW_D of the corresponding switch unit 120 are closed and the precharge switch SW_PC is opened.

For example, the battery module 100 having a preset turn for a size of battery voltage first connects a battery 110 to the bus bars 60 through a high current path. Then, other battery modules 100 determine terminal voltages between the first and second output terminals 101 and 102 based on the collected module information and control the charge, discharge, and precharge switches SW_C, SW_D, and SW_PC of the switch units 120 by comparing the corresponding battery voltages with the terminal voltages.

In accordance with one embodiment, an apparatus includes an interface to a bus connected to a plurality of first battery managers, and a second battery manager to transmit information of a corresponding battery module to the first battery managers through the interface and to receive information from the first battery managers through the interface, the second battery manager to generate a signal to control at least one switch based on the information from the first battery managers, the signal to control the at least one switch based on an inrush current condition. The interface may correspond to communication unit 133 in FIG. 4 or another type of interface. The first and second battery managers may correspond to the battery management units discussed herein. The at least one switch may correspond to any of the switch units discussed herein.

The signal may control the at least one switch when a difference between a voltage of the battery module and a voltage between first and second output terminals of the battery module is within an inrush current preset range. The switch control signal may be in accordance with any of the embodiments described herein, e.g., as shown in FIGS. 2, 4, and 5. The information may indicate a voltage of the battery module. The second battery manager is to transmit the information of a corresponding battery module to the first battery managers through the interface at a timing determined by an order of the second battery manger relative to the first battery managers. The order may be based on, for example, an identification number of the battery module an order of connection, or other information.

In accordance with one or more of the aforementioned embodiments, the battery system includes battery modules connected in parallel. The battery modules share different module information and are operated by internal algorithms based on the shared module information. For example, when one of the battery modules fails, the battery module with the failure may be replaced with a new battery module without an additional change of settings. During the replacement with a new battery module, inrush current does not occur. Thus, the effort to manage the battery system according to the one or more of the above embodiments may be reduced.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

The battery management units (or battery managers) and signal generating and signal processing features of the embodiments disclosed herein may be implemented in logic which, for example, may include hardware, software, or both. When implemented at least partially in hardware, the battery management units (or battery managers) and signal generating and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the battery management units (or battery managers) and signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A battery system, comprising:
a plurality of battery modules connected in parallel, each of the battery modules including:
a battery;
a first output terminal and a second output terminal;
a switch circuit connected between the battery and the first output terminal; and
a battery manager to detect a battery voltage of the battery and control the switch circuit, wherein each of the battery managers is connected to other battery managers through a communication bus and is to transmit module information of a corresponding battery module to the other battery managers, receive module information from the other battery managers, and control a corresponding switch circuit based on the module information.

2. The battery system as claimed in claim 1, wherein the module information indicates a battery voltage of the battery and a connection state of the switch circuit.

3. The battery system as claimed in claim 2, wherein each of the battery managers is to:
determine terminal voltage between the first output terminal and the second output terminal based on the module information,
compare battery voltage of a corresponding battery with the terminal voltage, and
control a connection state of a corresponding switch circuit based on a comparison result.

4. The battery system as claimed in claim 1, wherein the switch circuit includes:
a charge switch and a discharge switch connected in series between the battery and the first output terminal; and
a precharge switch and a precharge resistor connected in series between the battery and the first output terminal.

5. The battery system as claimed in claim 4, wherein:
the module information indicates a battery voltage of the battery and connection states of the charge switch, the discharge switch, and the precharge switch,
each of the battery managers is to determine a terminal voltage between the first output terminal and the second output terminal based on the module information,
the charge and discharge switches are to be opened and the precharge switch is to be closed when a difference between battery voltage of a corresponding battery and the terminal voltage is greater than a preset value, and
the charge and discharge switches are to be closed and the precharge switch is to be opened when the difference is equal to or less than the preset value.

6. The battery system as claimed in claim 5, wherein the battery manager for a battery module in which the charge and discharge switches are opened is to:
collect battery voltages of battery modules in which the charge and discharge switches are closed based on the module information, and
determine a terminal voltage between the first output terminal and the second output terminal based on the battery voltages of the battery modules in which the charge and discharge switches are closed.

7. The battery system as claimed in claim 4, wherein:
when the battery system is turned on, each of the battery managers is to collect battery voltages of the other battery modules from the module information, and
when a size of battery voltage of a corresponding battery module is in a preset order among sizes of battery voltages of the other battery modules, the charge and discharge switches of a corresponding switch circuit are to be closed and the precharge switch of the corresponding switch is to be opened.

8. The battery system as claimed in claim 1, wherein each of the battery managers has an identification number and is synchronized with the other battery managers.

9. The battery system as claimed in claim 8, wherein each of the battery managers is to transmit the module information to the other battery managers in an order determined by the identification numbers of the battery managers.

10. The battery system as claimed in claim 8, wherein the battery managers are to simultaneously detect battery voltages of corresponding batteries at a preset timing.

11. The battery system as claimed in claim 1, wherein each of the battery managers is to transmit the module information to the other battery managers by a broadcast method using the communication bus.

12. An apparatus, comprising:
an interface to a bus connected to a plurality of first battery managers; and
a second battery manager to transmit information of a corresponding battery module to the first battery managers through the interface and to receive information from the first battery managers through the interface, the second battery manager to generate a signal to control at least one switch based on the information from the first battery managers, the signal to control the at least one switch based on an inrush current condition.

13. The apparatus as claimed in claim 12, wherein the signal is to control the at least one switch when a difference between a voltage of the battery module and a voltage between first and second output terminals of the battery module is within an inrush current preset range.

14. The apparatus as claimed in claim 12, wherein the information indicates a voltage of the battery module.

15. The apparatus as claimed in claim 12, wherein the second battery manager is to transmit the information of a corresponding battery module to the first battery managers through the interface at a timing determined by an order of the second battery manager relative to the first battery managers.

16. The apparatus as claimed in claim 15, wherein the order is based on an identification number of the battery module.

* * * * *